United States Patent
Lavery et al.

(10) Patent No.: US 8,384,419 B2
(45) Date of Patent: Feb. 26, 2013

(54) SOFT-ERROR RESISTANT LATCH

(75) Inventors: Kevin P. Lavery, Sugar Land, TX (US);
Jason P. Whiles, Stafford, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 18 days.

(21) Appl. No.: 12/960,548

(22) Filed: Dec. 6, 2010

(65) Prior Publication Data
US 2012/0139578 A1 Jun. 7, 2012

(51) Int. Cl.
*H03K 19/003* (2006.01)
(52) U.S. Cl. .............................. 326/12; 326/9
(58) Field of Classification Search ................. None
See application file for complete search history.

(56) References Cited

U.S. PATENT DOCUMENTS

| | | | | |
|---|---|---|---|---|
| 5,801,551 A * | 9/1998 | Lin | ............................... | 326/113 |
| 6,327,176 B1 * | 12/2001 | Li et al. | ......................... | 365/156 |
| 7,570,080 B2 * | 8/2009 | Nintunze et al. | ............... | 326/95 |
| 2006/0082404 A1 * | 4/2006 | Ishii et al. | ..................... | 327/208 |
| 2007/0268056 A1 * | 11/2007 | Nakamura | .................... | 327/218 |

* cited by examiner

*Primary Examiner* — Crystal L Hammond
(74) *Attorney, Agent, or Firm* — Lawrence J. Bassuk; W. James Brady; Frederick J. Telecky, Jr.

(57) ABSTRACT

A soft-error resistant redundant latch including a first stage and second stage, each stage coupled to receive and to latch a binary signal in a latched state. Each stage is arranged to maintain the latched state at an intermediary node of the stage in response to a feedback path internal to the stage and in response to a stage output signal from the other stage. Each stage is arranged to generate a stage output signal in response to the latched state of the stage. The state of each stage is set to a first selected state by selectively coupling a stage set transistor between a first power rail and the intermediary node of the first stage in response to a set signal. The stage set transistor of the first stage and the stage set transistor of the second stage are complementary types.

1 Claim, 11 Drawing Sheets

SOFT-ERROR RESISTANT LATCH

BACKGROUND

Ever-decreasing feature sizes in electronics increases susceptibility to failures resulting from radiation associated with charged particles, high-energy neutrons, and thermal neutrons. Redundancy is used in various designs (such as in a master-slave flip-flop/latch design) reduces the likelihood of a radiation-induced change in the logic state of the designs. However, the added redundancy typically increases the size and topology of the design layout and relies on more widely separating critical nodes of latches. The node separation is also onerous because of the increases of the distances used to separate the critical nodes of the flip-flop, which typically results in larger latch sizes and increased manufacturing costs.

SUMMARY

The problems noted above are solved in large by using transistors in redundant circuits of differing technologies to reduce the opportunities for radiation-induced changes in the logic state of the redundant circuits. Using the differing technologies for transistors of the redundant circuits reduces the number of susceptible nodes and reduces the chance of a simultaneous change in state of the redundant circuits in response to a single-event transient caused by radiation. As disclosed herein, a soft-error resistant redundant latch includes a first stage and second stage, with each stage coupled to receive and to latch a binary signal in a latched state. Each stage is arranged to maintain the latched state at an intermediary node of the stage in response to a feedback path internal to the stage and in response to a stage output signal from the other stage. Each stage is also arranged to generate a stage output signal in response to the latched state of the stage. The state of each stage is set to a first selected state by selectively coupling a stage set transistor between a first power rail and the intermediary node of the first stage in response to a set signal. The stage set transistor of the first stage and the stage set transistor of the second stage are complementary types. Thus, for example, the stage set transistor of the first stage can be a PMOS transistor while the stage set transistor of the second stage is an NMOS transistor (or, NMOS and PMOS transistors respectively for the first and second stages).

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular system components. As one skilled in the art will appreciate, various names can be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . " Also, the terms "coupled to" or "couples with" (and the like) are intended to describe either an indirect or direct electrical connection. Thus, if a first device couples to a second device, that connection can be through a direct electrical connection, or through an indirect electrical connection via other devices and connections.

Figure 1:
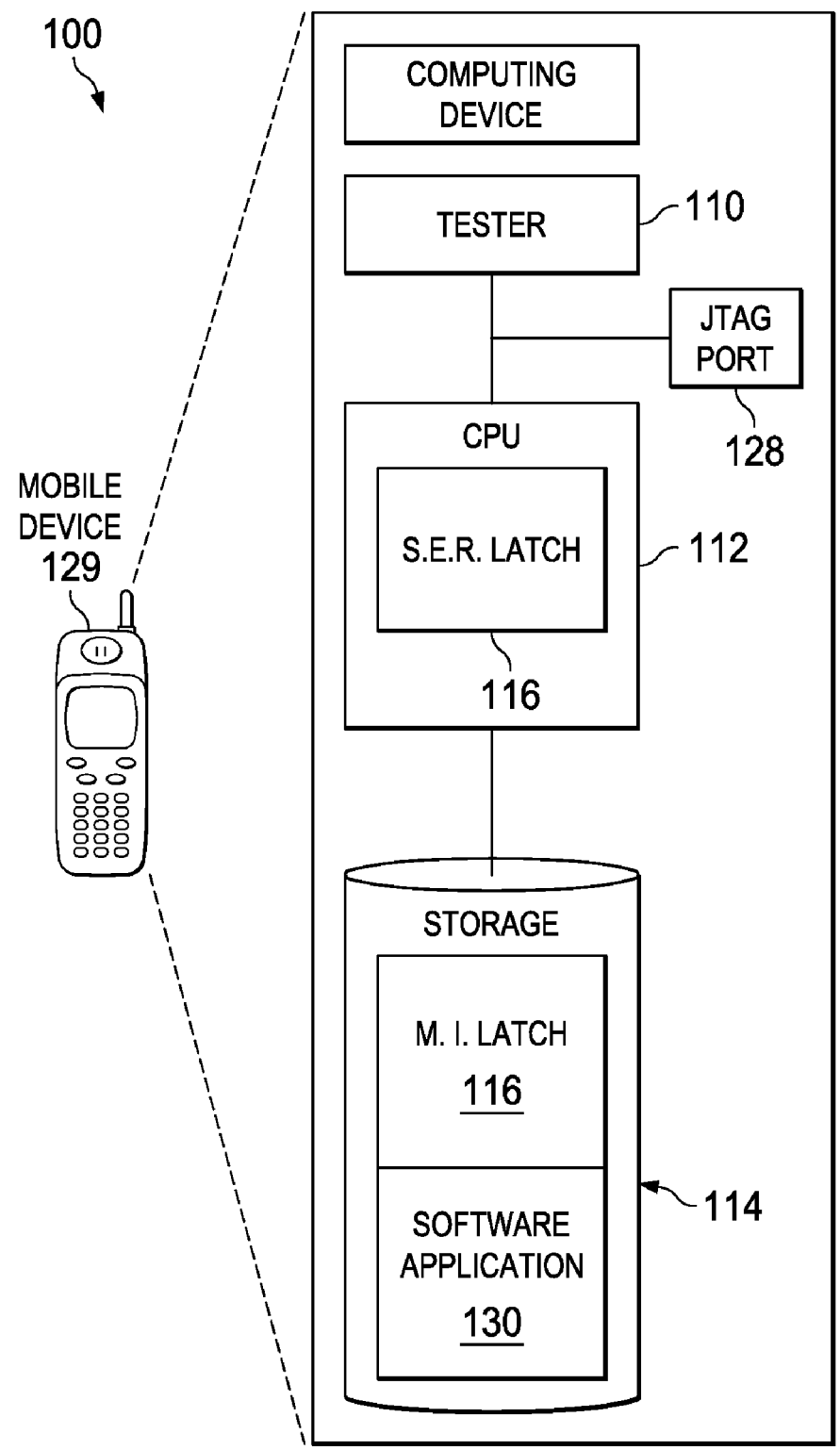
FIG. 1 shows an illustrative computing device 100 in accordance with embodiments of the disclosure.

FIG. 1 shows an illustrative computing device 100 in accordance with embodiments of the disclosure. The computing device 100 is, or is incorporated into, a mobile communication device 129, such as a mobile phone, a personal digital assistant (e.g., a BLACKBERRY® device), a personal computer, or any other type of electronic system.

In some embodiments, the computing device 100 comprises a megacell or a system-on-chip (SoC) which includes control logic such as a CPU 112 (which, for example, can be a CISC-type CPU, RISC-type CPU, or a digital signal processor (DSP)), a storage 114 (e.g., random access memory (RAM)) and tester 110. The storage 114 stores one or more software applications 130 (e.g., embedded applications) that, when executed by the CPU 112, perform any suitable function associated with the computing device 100. The tester 110 comprises logic that supports testing and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s)
} would interact with the software application 130). In this way, the software application 130 can be debugged in an environment which resembles post-production operation.

The CPU 112 typically comprises memory and logic which store information frequently accessed from the storage 114. Various subsystems (such as the CPU 112 and the storage 114) of the computing device 100 include soft-error resistant latches (e.g., S.E.R. Latches 116), which are used during the execution the software application 130. Errors can occur during the execution of the software application 130 that negatively affect the results of the execution.

Soft-errors occur in circuits implemented in a common substrate. The soft-errors are often caused by single-event transients caused by an energetic, charged particle of radiation passing through portions of closely situated transistors of the circuits in the substrate. The circuits typically include logic circuits (such as latches, flip-flops, and/or other memory devices) that rely upon feedback to maintain a logic state. The feedback signal includes actively driven signals as well as signals resulting from a stored capacitive charge.

With increased scales of integration, a single-event transient is increasingly more capable of changing the states of even devices having redundant feedback paths by causing charge separation is both of the redundant feedback paths. Disclosed herein are techniques for high-efficiency, feedback-based memory devices that reduce the incidence of soft-errors that occur in transistors of critical nodes of the feedback paths. As used herein, the term "critical nodes" includes nodes having transistors that are susceptible to effects of single-event transients, including nodes having transistors that are biased in at least one of several different ways during operation, and also including single-event transients that cause a current pulse in both of the redundant feedback paths.

As an example, asynchronous drivers are disclosed herein that rely upon opposing voltage states so that they are less likely to change state during a single-event transient. A disclosed CMOS embodiment uses both NMOS and PMOS drivers. More specifically, a PMOS preset driver is susceptible to changing state during a single-event transient when the drain of the PMOS preset driver is low, while the NMOS preset driver is not susceptible when its drain is low. Similarly, a NMOS preset driver is susceptible to changing state during a single-event transient when its drain is high, while the PMOS preset driver is not susceptible when its drain is high. The disclosed drivers are arranged such that opposing voltages are used to reduce the chance that the substrates and drains of critical nodes are reverse-biased when a single-event transient occurs.

The techniques are employed, for example, in latches such as D-latches, flip-flops, monostable multivibrators, and the like. The design cell can be used by a design engineer, for example, when designing circuitry in which reduced susceptibility to soft-errors is desired, but without requiring the designer to know (and/or provide) implementation details of how the critical nodes are to be efficiently isolated.

The rate of soft-errors depends on the incidence of charged particles passing through material used in circuits (such as devices formed within an integrated circuit). The charged particles interact primarily in regions of the electron shells of atoms because the electron orbitals primarily define an atomic radius for matter and thus the electrons tend to shield the nucleus. The mass difference between a nucleon (and/or charged particle) and an electron implies that the particle itself does not substantially deflect. Rather, the charged particle deflects electrons from their existing state/shell via a Coulomb force exerted by the charged particle. The work expended to influence electrons thus slows the incident charged particle and also displaces some electrons, which leaves a wake of charge separation.

The charge separation occurring in the wake of the charged particle tends to recombine in the structure in which the charge separation occurs. However, if the charge separation occurs in a volume ("critical volume") where there is an external voltage gradient (such as found in certain structures and conditions in CMOS devices), the externally applied voltage gradient tends to sweep electrons towards the higher voltage. The nodes that collect charge receive a transient current pulse that results from the swept electrons or holes. The sweeping of separated charge into a node is self-limited, and the transient current can change the logical state of the node by overcoming the external voltage gradient. The Coulomb attraction between the separated charges tends to recombine these separated charges after the charges are formed. Accordingly, the pulse width of the transient current is typically limited by charge mobility.

In CMOS devices, soft-errors can occur when separated charge is swept from a substrate (or well) to a drain of a transistor. For example, positive carriers ("holes") of the separated charge can be swept towards the drain junction (from the n-well of) of a PMOS transistor having a source coupled to VCC and the drain that is presently in a low state. (See, in FIG. 2, for example, transistors MP17A and MP18A, which are susceptible to soft-errors when the drain nodes are in a low state.) PMOS transistors having a source coupled to VCC and a drain in a high state are not susceptible to soft-errors because no substantial voltage gradient exists.

Likewise, negative carriers ("electrons") of the separated charge can be swept towards the drain junction (from the substrate of) of an NMOS transistor having a source coupled to VSS and the drain presently in a high state. (See, in FIG. 2, for example, transistors MN11A and MN13A which are susceptible to soft-errors when the drain nodes are in a high state.) NMOS transistors having a source coupled to VSS and a drain in a low state are not susceptible to soft-errors because no substantial voltage gradient exists.

The susceptibility of a latch (for example) in an integrated circuit to soft-errors can be determined by the type of the radiation source and the relative locations of critical nodes of the latch to the induced charge separation. The charged particles in the silicon typically result from one of three radiation sources: alpha particles, thermal neutrons, and high-energy (e.g., cosmic) neutrons. Alpha particles (having a kinetic energy of around 10 MeV) typically have a relatively short range: such as around 8-10 cm in air, around 70-100 µm in silicon, and around 30 µm in copper. Accordingly, the source of the alpha particles would normally have to be relatively close to the silicon in order to cause soft-errors in a latch on the integrated circuit. Thus, separating critical nodes by a distance that is greater than the range of the alpha particles can substantially eliminate alpha particle-induced soft errors (whereas separating critical nodes by a distance that is around or even less than the range of the alpha particles in the substrate can also substantially reduce alpha particle-induced soft errors). An example of an alpha particle source that can affect integrated circuits is a package of the integrated circuit that contains trace radioactive material.

Thermal neutrons create charged particles by moving (recoil) or splitting (spallation) the nucleus of an atom in the substrate (or well) of the integrated circuit. Dopants used in integrated circuits typically contain atoms that are capable of absorbing thermal neutrons. For example, a relatively stable isotope of boron (the $^{10}$B isotope, which naturally occurs in around 20 percent of boron), can absorb thermal neutrons resulting in a nuclear fission reaction, which produces an alpha particle, a gamma ray, and a lithium ion. The products of the fission products can cause charge separation that induces soft-errors as discussed above. Depleted boron (which is substantially all $^{11}$B) can be used to substantially reduce the incidence of thermal neutron-induced soft-error radiation. Soft-errors can also result from incident high-energy neutrons that are created when charged particles from the cosmic background interact with the earth's atmosphere.

Figure 2:
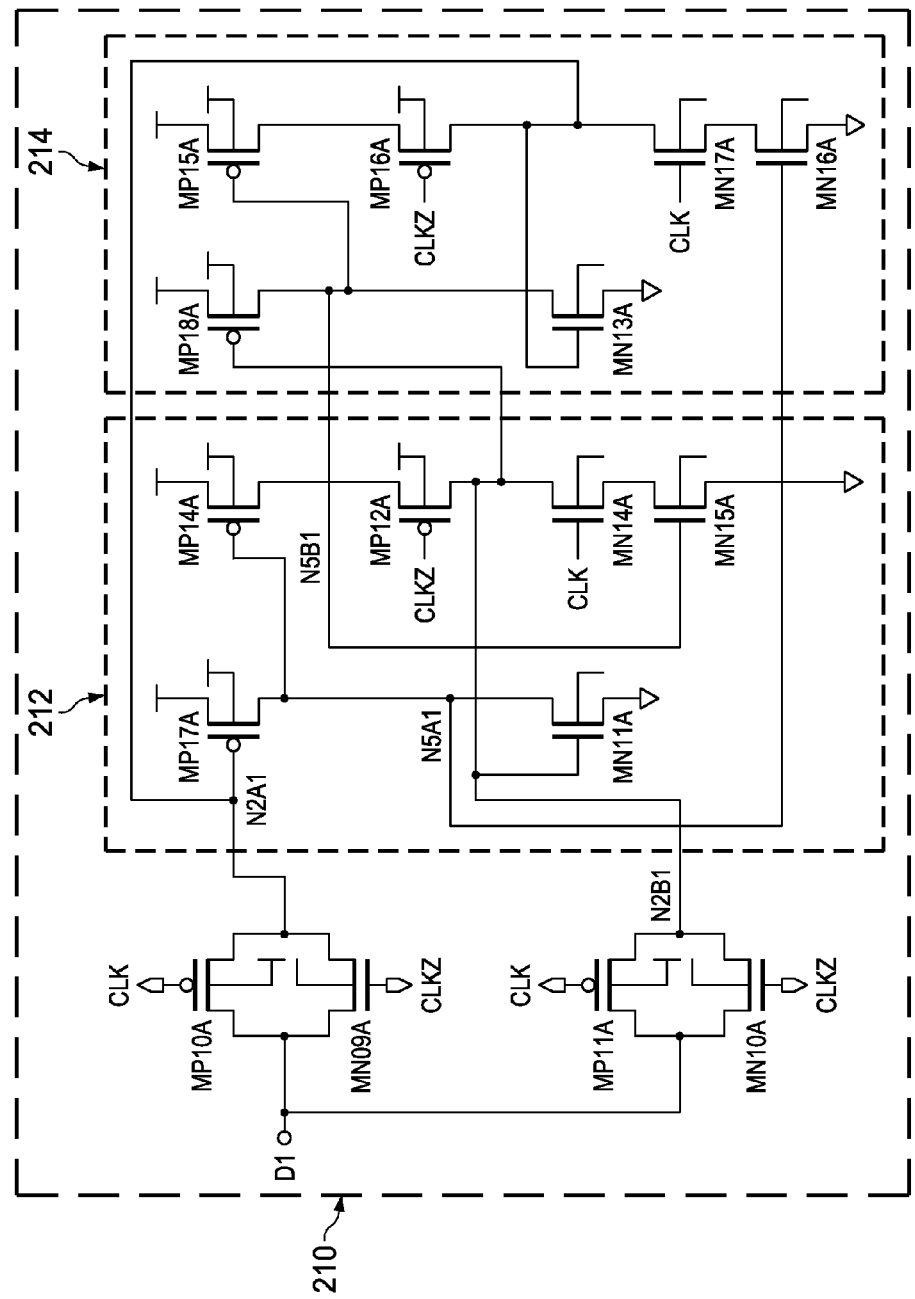
FIG. 2 is a schematic diagram illustrating a conventional dual redundant latch.

FIG. 2 is a schematic diagram illustrating a conventional dual redundant latch in accordance with embodiments of the disclosure. Signals CLK and CLKZ are used to latch signal D1 synchronously in latch 210 (via transistors MP10A, MN09A, MP11A, and MN10A). Transistors MP10A, MN09A, MP11A, and MN10A are paired to form transfer gates that are used to alternately pass or block signal D1 at nodes N2A1 and N2B1 (respectively). The latch 210 stores data using redundant inverters (such as the cross-coupled inverter of each stage 212 and 214 of latch 210). Latch 210 thus maintains a given data state at nodes N2A1 and N2B1 through active feedback.

As indicated above for latch 210, critical nodes exist at the drains of transistors MP17A, MN14A, MN15A, MP18A, MN17A, and MN16A or the drains of transistors MN11A, MP12A, MN13A, MP14A, MP15A, and MP16A, depending on how the transistors are biased in operation (see below). Stage 212 of latch 210 includes two inverters (formed by transistors MP17A and MN11A and by transistors MP14A, MP12A, MN14A, and MN15A, respectively) that are (in conjunction with stage 214) cross-coupled to store data. Because a soft-error can disturb the stored-data-state of the latch, a second redundant stage 214 of latch 210 is provided that includes two additional inverters (formed by transistors MP18A and MN13A and by transistors MP15A, MP16A, MN17A, and MN16A respectively).

Without the redundant stage, a current pulse caused by a charged particle that disturbed the input to only one inverter would cause the output—and the input to the next inverter—to "flip" states: the flipped state will be latched if the current-pulse persists long enough for the positive feedback to propagate and latch the error. The redundant architecture of the latch helps to ensure that the latch will not flip to a charged particle disturbance at a single critical node. (As explained below, it is still possible that a single-event transient will cause even a redundant architecture latch to flip states when critical nodes are too closely spaced together.)

In operation, latch 210 can have the nodes N2A1 and N2B1 set to a state "1" (e.g., high) with nodes N5A1 and N5B1 set to a state "0" (e.g., low). In this configuration, the drains of transistors MP17A, MN14A, MN15A, MP18A, MN17A, and MN16A are biased so that they are susceptible to soft-errors. When nodes N2A1 and N2B1 are set to a state "0" with nodes N5A1 and N5B1 set to a state "1," the drains of transistors MN11A, MP14A MP12A, MN13A, MP15A, MP16A are biased so that they are susceptible to soft-errors. Because of the redundancy, a single soft-error at a single critical node is less likely to cause a change in the state of the latch 210.

However, the redundant topology can fail when multiple nodes flip at the same time (e.g., MP17A and MP18A). Thus if the node at the drain of MP17A changes state as a result of a charged particle disturbance, a disturbance (including all disturbances caused by a single cosmic neutron, for example) at any one (or possibly more) of the other critical nodes (at the drains of MN14A, MN15A, MP18A, MN16A and MN17A) would likely cause the latch 210 to flip states.

Because simultaneous disturbances of the critical nodes can cause a soft-error to be latched, decreasing the spacing between the nodes (such as when using increasingly smaller features sizes) raises the possibility that a single-event transient would affect multiple critical nodes (which might then be latched).

Figure 3:
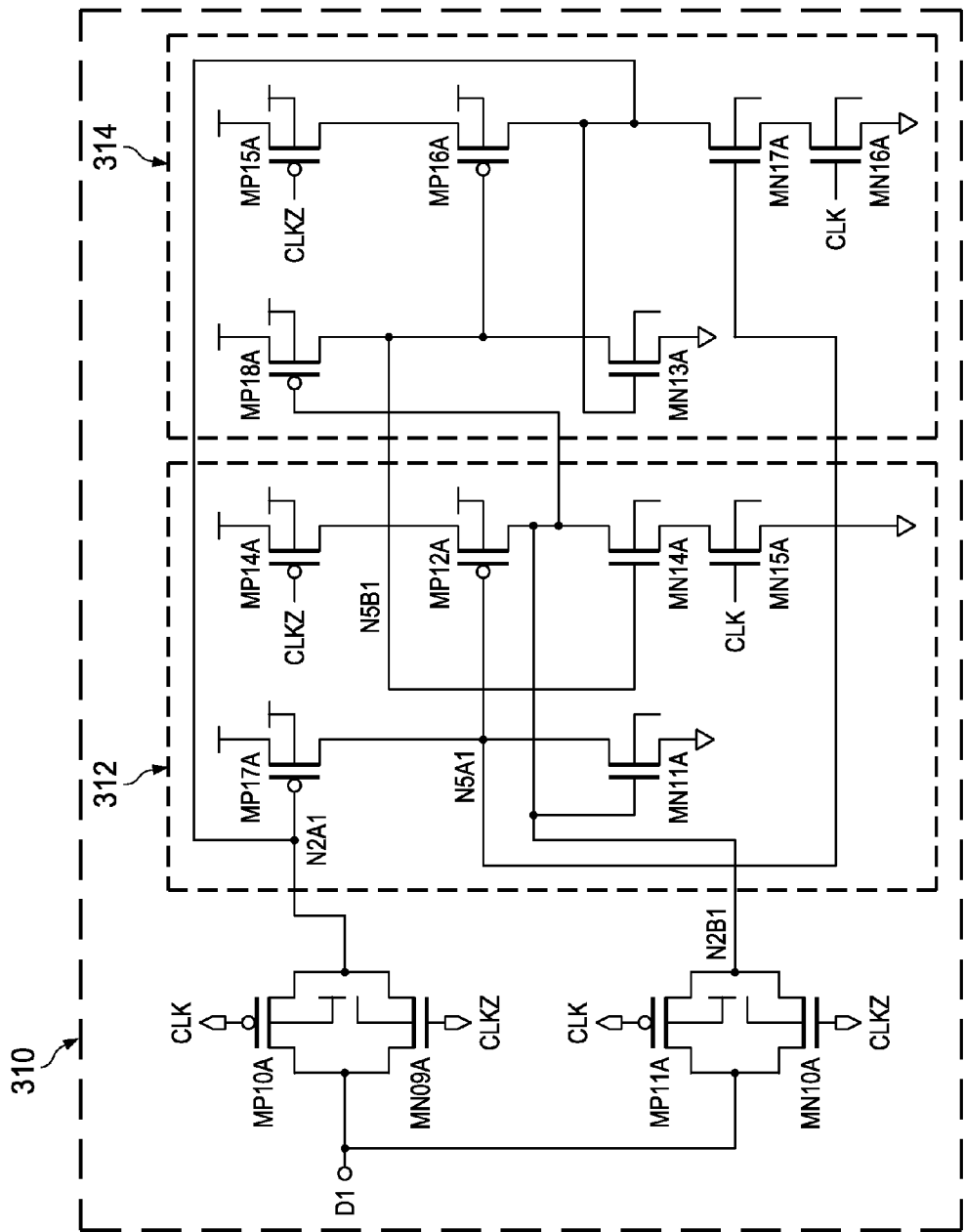
FIG. 3 is a schematic diagram illustrating a soft-error resistant latch in accordance with embodiments of the disclosure.

FIG. 3 is a schematic diagram illustrating a soft-error resistant latch in accordance with embodiments of the disclosure. Latch 310 has increased resistance to soft-errors (over latch 210, for example) at least because latch 310 is arranged to reduce the number of nodes that are susceptible to single-event transients.

In operation, signals CLK and CLKZ are used to load signal D1 synchronously in latch 310 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 310. The latch 310 stores data using redundant inverters (such as the cross-coupled inverter of each stage 312 and 314 of latch 310). Latch 310 thus maintains a given data state at nodes N2A1 and N2B1 through active feedback.

In contrast to the latch 210 discussed above, fewer critical nodes exist, such as at the drains of transistors MP17A, MN14A, MP18A, MN17A, and or the drains of transistors MN11A, MP12A, MN13A, MP16A, depending on how the transistors are biased. Thus, latch 310 has eight critical nodes that are possible, as compared with the 12 critical nodes that are possible with the latch 210. The reduction in critical nodes within the latch 310 decreases the possibility that the latch 310 would flip states due to a single-event transient.

The clock gating nodes are arranged to be insensitive to soft errors. For example, transistors MP14A and MP12A are arranged so that MP14A is "outside" (e.g., closest to the power rail VSS). Transistors MN14A and MN15A are arranged so that MN15A is "outside" (e.g., closest to the power rail VDD). Transistors MP15A and MP16A are arranged so that MP15A is "outside" (e.g., closest to the power rail VSS). Transistors MN16A and MN17A are arranged so that MN16A is "outside" (e.g., closest to the power rail VDD).

Clock node CLKZ is coupled to the gates of transistors MP14A and MP15A, while clock node CLK is coupled to the gates of transistors MN15A and MN16A. When CLK is high (and node CLKZ is low, latch 312 is latched, and the clocked transistors in stage 312 and stage 314 of latch 310 are ON, which drives the redundant feedback paths. In this arrangement, the conditions for establishing a critical node in a latched state are avoided because no substantial voltage gradient is established across the drain-substrate junctions of the clocked transistors when the latch 312 is in a latched state. As discussed above, PMOS transistors having a source coupled to VCC and a drain in a high state (as well as NMOS transistors having a source coupled to VSS and a drain in a low state) are not susceptible to soft-errors.

Reducing the number of critical nodes (e.g., nodes that are susceptible to single-event transients) also allows greater scales of integration because fewer nodes in the latch have spacing restrictions relative to other nodes. Thus, in latch 312, the clocked transistors (e.g., the transistors having their gates coupled to a clocking signal such as CLK or CLKZ) do not have to be spaced so as to prevent single-event transients from changing their state while in a latched mode.

Figure 4:
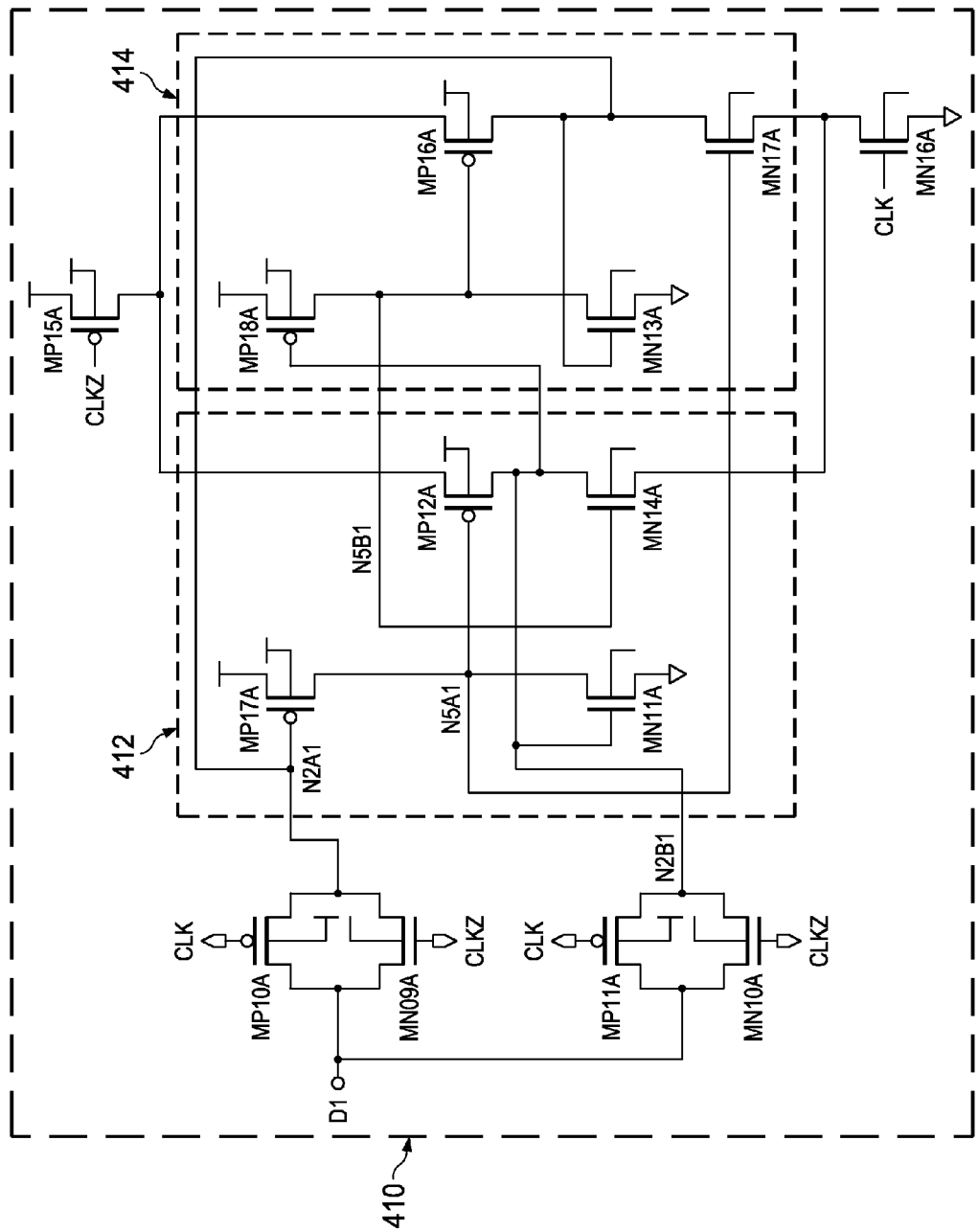
FIG. 4 is a schematic diagram illustrating a reduced-transistor soft-error resistant latch in accordance with embodiments of the disclosure.

FIG. 4 is a schematic diagram illustrating a reduced-transistor soft-error resistant latch in accordance with embodiments of the disclosure. Latch 410 has fewer transistors (over latch 310, for example) while maintaining a lower resistance to soft-errors (over latch 210, for example) at least because latch 410 is arranged to reduce the number of nodes that are susceptible to single-event transients.

In operation, signals CLK and CLKZ are used to load signal D1 synchronously in latch 410 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 410. The latch 410 stores data using redundant inverters (such as the cross-coupled inverter of each stage 412 and 414 of latch 410). Latch 410 thus maintains a given data state at nodes N2A1 and N2B1 through active feedback.

In contrast to the latch 210 discussed above, fewer critical nodes exist, such as at the drains of transistors MP17A, MN14A, MP18A, MN17A, and or the drains of transistors MN11A, MP12A, MN13A, MP16A, depending on how the transistors are biased. Thus, latch 410 has eight critical nodes that are possible, as compared with the 12 critical nodes that are possible with the latch 210. The reduction in critical nodes within the latch 410 decreases the possibility that the latch 410 would flip states due to a single-event transient.

In contrast to latch 310 above, latch 410 has fewer clock gating nodes. The remaining clock gating nodes are arranged to be insensitive to soft errors. For example, transistors MP15A and MN16A are arrange so that each transistor is "outside" (e.g., closest to a power rail). Transistor MP15A is arranged to drive the "high side" of portions of both stages 412 and 414. Transistor MN16A is arranged to drive the "low side" of portions of both stages 412 and 414. Accordingly, a single PMOS transistor is coupled to VSS and is used to control the latching of the PMOS transistors in both the first and second stages (412 and 414), and a single NMOS transistor is coupled to VDD that is used to control the latching of the NMOS transistors in both the first and second stages.

The single PMOS transistor (MP15A) and the single NMOS transistor (MN16A) can be also used to drive stages of other (e.g., vectored) redundant latches. Driving other (similarly controlled) redundant latches reduces design transistor counts and the relative number of critical nodes, which provides higher design densities and increased resistance against soft-errors.

Clock node CLKZ is coupled to the gates of transistors MP15A, while clock node CLK is coupled to the gates of transistors MN16A. When CLK is high (and node CLKZ is low, latch 412 is latched, and the clocked transistors in stage 412 and stage 414 of latch 410 are on (e.g., conduct), which drives the redundant feedback paths. In this arrangement, the conditions for establishing a critical node in a latched state are avoided because no substantial voltage gradient is established across the drain-substrate junctions of the clocked transistors when the latch 412 is in a latched state. As discussed above, PMOS transistors having a source coupled to VCC and a drain in a high state (as well as NMOS transistors having a source coupled to VSS and a drain in a low state) are not susceptible to soft-errors.

Figure 5:
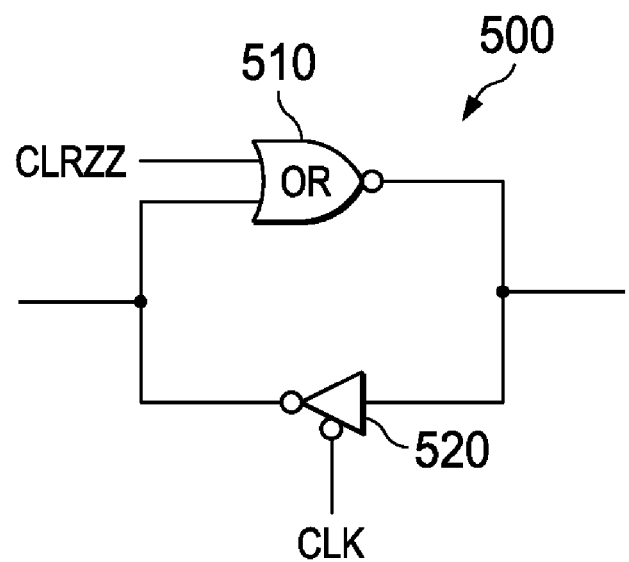
FIG. 5 is a simplified logic diagram illustrating a soft-error resistant latch with asynchronous clear in accordance with embodiments of the disclosure.

FIG. 5 is a simplified logic diagram illustrating a soft-error resistant latch with asynchronous clear in accordance with embodiments of the disclosure. Storage circuit 500 includes a logic gate 510 and a logical gate 520 arranged in a feedback loop to provide active feedback for latching a logical state.

Logic gate 510 is a NOR-type logic gate that receives a clear signal (at node CLRZZ) for clearing the storage circuit 500. As discussed below with reference to FIGS. 7 and 8, the clear signal for node CLRZZ is an inversion of a CLRZ signal, which is made for the purpose of avoiding the creation of a critical node in the layout of circuit 500. (The inverter can be used to generate the signal at node CLRZZ can be also used to drive stages of other similarly controlled redundant latches to reduce design transistor counts increase resistance against soft-errors.) Logic gate 510 also receives the feedback path signal which is either driven by a logical input signal (for storing the value of the logical input) or the (tri-state) logic gate 520.

Logic gate 520 is arranged to receive the output of logic gate 510 and to provide positive feedback in response to the clock signal at node CLK. The clock signal controls the output impedance of gate 520 to alternately allow the feedback node to be driven by a logic input or by positive feedback produced in response to the output of gate 510. Accordingly, memory circuit 500 can be asynchronously cleared by asserting a clear signal at node CLRZZ while gate 520 is in feedback mode.

Figure 6:
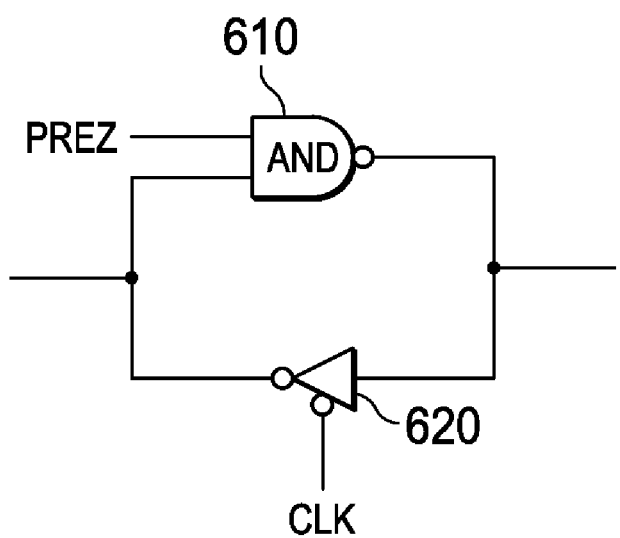
FIG. 6 is a simplified logic diagram illustrating a soft-error resistant latch with asynchronous preset in accordance with embodiments of the disclosure.

FIG. 6 is a simplified logic diagram illustrating a soft-error resistant latch with asynchronous preset in accordance with embodiments of the disclosure. Storage circuit 600 includes a logic gate 610 and a logical gate 620 arranged in a feedback loop to provide active feedback for latching a logical state.

Logic gate 610 is a NAND-type logic gate that receives a preset ("set") signal (at node PREZ) for clearing the storage circuit 600. As discussed below with reference to FIGS. 9 and 10, the preset signal for node PREZ is inverted to generate a PREZZ signal, which is made for the purpose of avoiding the creation of a critical node in the layout of memory circuit 600. (The inverter can be used to generate the signal at node PREZZ can be also used to drive stages of other similarly controlled redundant latches to reduce design transistor counts increase resistance against soft-errors.) Logic gate 610 also receives the feedback path signal which is either driven by a logical input signal (for storing the value of the logical input) or the (tri-state) logic gate 620.

Logic gate 620 is arranged to receive the output of logic gate 610 and to provide positive feedback in response to the clock signal at node CLK. The clock signal controls the output impedance of gate 620 to alternately allow the feedback node to be driven by a logic input or by positive feedback produced in response to the output of gate 610. Accordingly, memory circuit 600 can be asynchronously preset by asserting a clear signal at node PREZ while gate 620 is in feedback mode.

Figure 7:
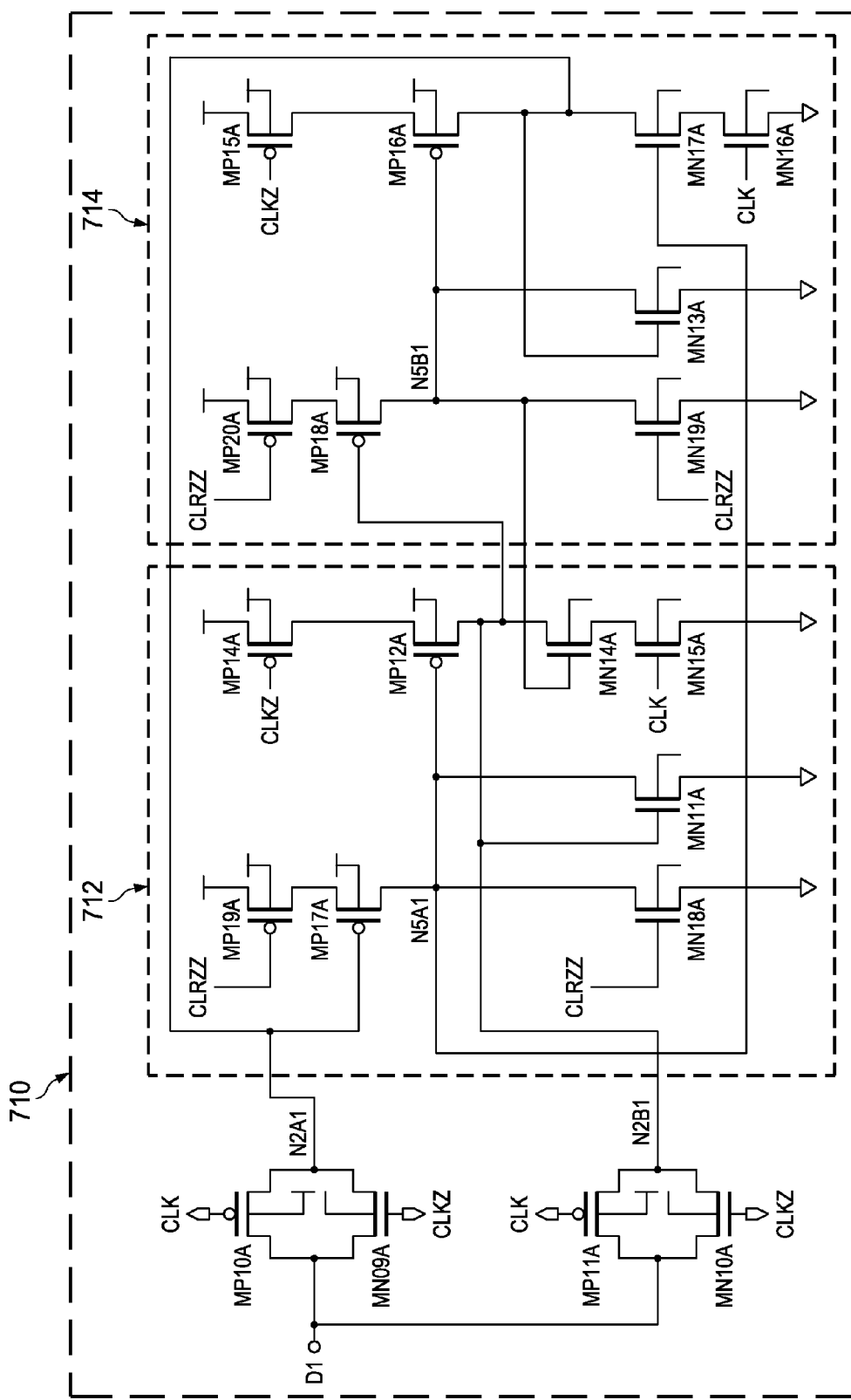
FIG. 7 is a schematic diagram illustrating a soft-error resistant latch with asynchronous clear in accordance with embodiments of the disclosure.

FIG. 7 is a schematic diagram illustrating a soft-error resistant latch with asynchronous clear in accordance with embodiments of the disclosure. Latch 710 has an asynchronous clear mechanism as well as a lower susceptibility to soft-errors (over latch 210, for example) at least because latch 710 is arranged to reduce the number of nodes at clocked transistors that are susceptible to single-event transients.

In operation, signals CLK and CLKZ are used to load signal D1 synchronously in latch 710 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 710. The latch 710 stores data using redundant inverters (such as the cross-coupled inverter of each stage 712 and 714 of latch 710). Latch 710 thus maintains a given data state at nodes N2A1 and N2B1 through active feedback.

In contrast to the latch 210 discussed above, fewer critical nodes exist, such as at the drains of transistors MP17A, MN14A, MP18A, MN17A, MN11A, MP12A, MN13A, MP16A, depending on how the transistors are biased. Thus, latch 710 has eight critical nodes that are possible (exclusive of the asynchronous clear drivers as discussed below), as compared with the 12 critical nodes that are possible with the latch 210. The reduction in critical nodes within the latch 710 decreases the possibility that the latch 710 would flip states due to a single-event transient.

In contrast to latch 310 above, latch 710 has transistors MP19A, MN18A, MP20A, and MN19A that are configured to clear latch 710 when a clear signal is asserted at node CLRZZ. When the clear signal is asserted (e.g., signal CLRZZ), nodes N2A1 and N2B1 are forced high (through a feedback path) which disables transistors MP17A and MP18A. Single-event transients that occur near MP19A and MP20A typically do not cause soft errors because the off-state of MP17A and MP18A separate the node from any control gate. Single-event transients that occur near transistors MN18A and MN19A do not cause soft errors because the NMOS transistors have a negligible substrate-to-drain voltage.

When the clear signal is inactivated (and latch 710 in either a load data or a latched state), the state at nodes N2A1 and N2B1 can be low or high (for both nodes simultaneously). When the nodes N5A1 and N5B1 are high, transistors MP19A and MP20A are on (e.g., conducting), and are not susceptible (to a soft error resulting from single-event transient) because there is no drain-to-well voltage gradient, while transistors MN18A and MN19A are susceptible to a soft error because there is a drain-to-substrate voltage gradient. When the nodes N5A1 and N5B1 are low, transistors MP19A and MP20A are on (e.g., conducting), and are not susceptible to a soft error because there is no drain-to-well voltage gradient, and transistors MN18A and MN19A are not susceptible to a soft error because both the drain and substrate are low and there is no drain-to-substrate voltage gradient. Single-event transients that occur near transistors MP19A and MP20A do not cause soft errors because the PMOS transistors have a negligible well-to-drain voltage. Single-event transients that occur near transistors MN18A and MN19A may cause soft errors when nodes N5A1 and N5B1 are high if the associated critical nodes are substantially closely spaced.

Clock node CLKZ is coupled to the gates of transistors MP14A and MP15A, while clock node CLK is coupled to the gates of transistors MN15A and MN16A. When CLK is high (and node CLKZ is low, latch 712 is latched, and the clocked transistors in stage 712 and stage 714 of latch 710 are ON, which drives the redundant feedback paths. In this arrangement, the conditions for establishing a critical node in a latched state are avoided because no substantial voltage gradient is established across the drain-substrate junctions of the clocked transistors when the latch 712 is in a latched state.

Figure 8:
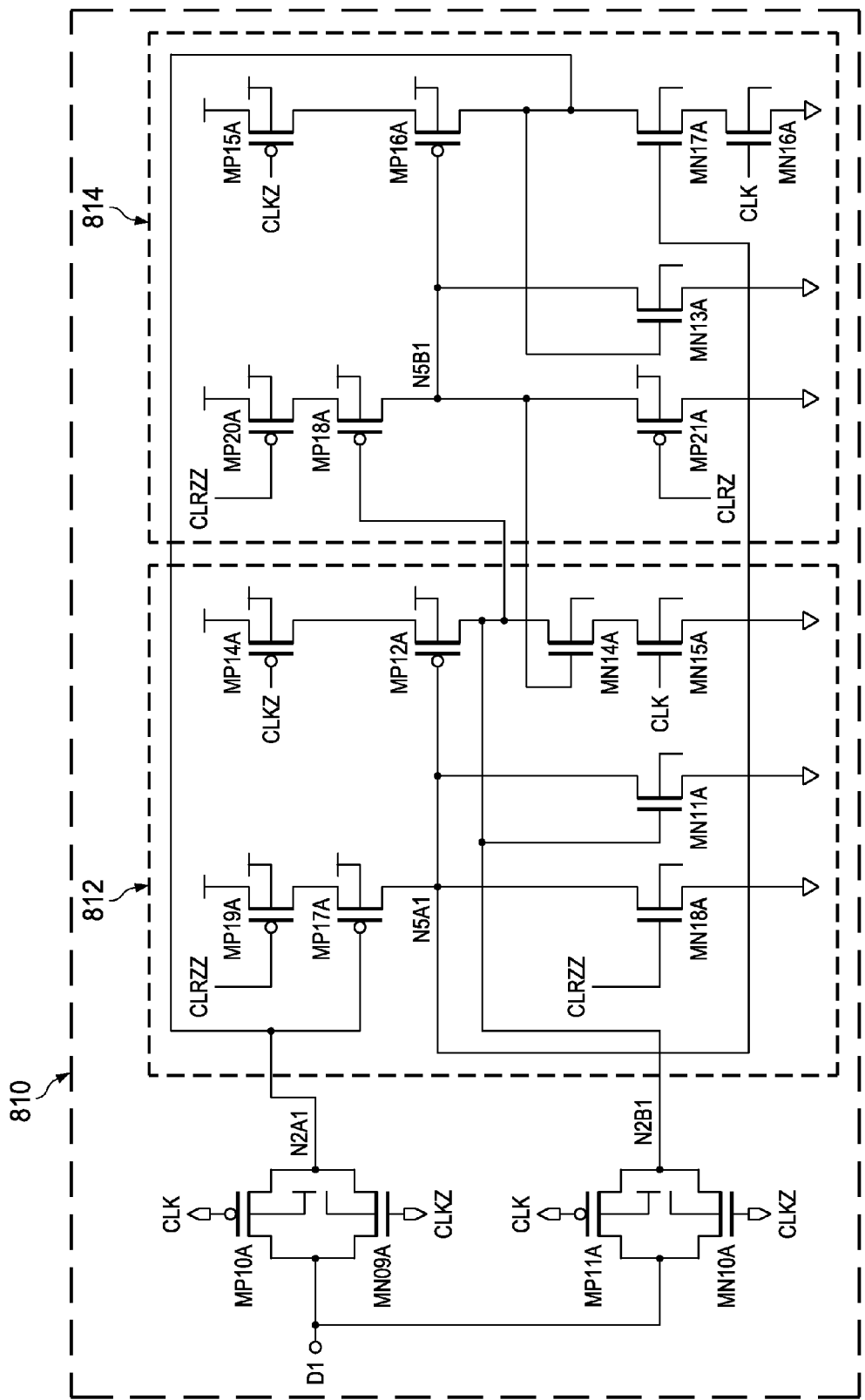
FIG. 8 is a schematic diagram illustrating a soft-error resistant latch with asynchronous clear transistors of opposite polarities in accordance with embodiments of the disclosure.

FIG. 8 is a schematic diagram illustrating a soft-error resistant latch with asynchronous clear transistors of opposite polarities in accordance with embodiments of the disclosure. Latch 810 has an asynchronous clear mechanism as well as a lower susceptibility to soft-errors (over latch 710, for example) at least because latch 810 is has two redundant stages 812 and 814, each of which is controlled by a clear signal that is applied using mutually differing polarities.

In operation, signals CLK and CLKZ are used to load signal D1 synchronously in latch 810 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 810 to the value of signal D1. The latch 810 stores data using redundant inverters (such as the cross-coupled inverter of each stage 812 and 814 of latch 810). Latch 810 thus maintains a given data state at nodes N2A1 and N2B1 through active feedback.

In contrast to the latch 210 discussed above, fewer critical nodes exist, such as at the drains of transistors MP17A, MN14A, MP18A, MN17A, MN11A, MP12A, MN13A, MP16A, depending on how the transistors are biased. Thus, latch 810 has eight critical nodes that are possible (exclusive of the asynchronous clear as discussed below), as compared with the 12 critical nodes that are possible with the latch 210. As disclosed herein, transistors MN18A and MP21A (in separate stages) are not susceptible at the same time, which enables a first stage to reset a second stage that erroneously flips states. The reduction in critical nodes within the latch 810 decreases the possibility that the latch 810 would flip states due to a single-event transient.

Latch 810 has transistors MP19A, MN18A, MP20A, and MN21A that are configured to clear latch 810 when a clear signal is asserted at nodes CLRZ and CLRZZ. In contrast to latch 710 described above, stage 814 of latch 810 has the PMOS transistor MP21A that is coupled directly to the lower supply rail and is controlled by the signal at node CLRZ. The signal at node CLRZZ is the logical inversion of the signal at node CLRZ and thus the nodes CLRZ and CLRZZ are at opposing polarities. Node CLRZ is coupled to the gate of PMOS transistor MP21A, which has a source coupled to VDD.

When the clear signal is asserted, nodes N2A1 and N2B1 are forced high (through the feedback path) which disables transistors MP17A and MP18A. In this state, transistors MP19A and MP20A do not add to the susceptibility of the latch because transistors MP17A and MP18A are turned off and are separated from any node that is coupled to a control gate. Likewise, transistor MN18A is not susceptible to single-event transients that occur nearby (because there is no voltage gradient from drain to substrate), while transistor MP21A is not susceptible to single-event transients that occur nearby because of the redundancy of the latch 810. A single-event transient occurring near complementary transistors MN18A and MP21A during assertion of the clear signal would not cause a change in the state of the latch because transistors MN18A and MP21A are not susceptible at the same time.

Node N5A1 of the first stage is an intermediary node that is, for example, the output of a first inverter that drives a second inverter of the first stage. Node N5B1 of the second stage is an intermediary node that is, for example, the output of a first inverter that drives a second inverter of the second stage. The state of nodes N5A1 and N5B1 typically reflect the state of latch 810 because, for example, the nodes are separated by a series of two inverters, and are cross-coupled with active feedback paths for driving the nodes.

When the clear signal is inactivated (e.g., deasserted), the nodes N2A1 and N2B1 may be high or low. When the nodes N5A1 and N5B1 are high, transistors MP19A and MP20A are on (e.g., conducting), and are not susceptible (to a soft error resulting from single-event transient) because there is no drain-to-well voltage gradient, transistor MP21A is not susceptible because there is no drain-to-well voltage gradient, while transistor MN18A is susceptible to a soft error because there is a drain-to-substrate voltage gradient. When the nodes N5A1 and N5B1 are low, transistors MP19A and MP20A are on (e.g., conducting), and are not susceptible to a soft error because there is no drain-to-well voltage gradient, transistor MN18A is not susceptible to a soft error because both the drain and substrate are low and there is no drain-to-substrate voltage gradient, while transistor MP21A is susceptible to a soft error because of the drain-to-well voltage gradient. Single-event transients that occur near transistors MP19A and MP20A do not cause soft errors because the PMOS transistors have a negligible well-to-drain voltage. Single-event transients that occur near transistors MN18A and MP21A do not cause soft errors because the associated critical nodes are not susceptible at the same time and do not cause the state of latch 810 to flip (because, for example, of the redundancy provided by stages 812 and 814). Accordingly, the asynchronous clear drivers of latch 810 are immune to soft errors when the clear signal (e.g., CLRZZ) is not asserted.

Clock node CLKZ is coupled to the gates of transistors MP14A and MP15A, while clock node CLK is coupled to the gates of transistors MN15A and MN16A. When CLK is high (and node CLKZ is low, latch 812 is latched, and the clocked transistors in stage 812 and stage 814 of latch 810 are on, which drives the redundant feedback paths. In this arrangement, the conditions for establishing a critical node in a latched state are avoided because no substantial voltage gradient is established across the drain-substrate junctions of the clocked transistors when the latch 812 is in a latched state.

Figure 9:
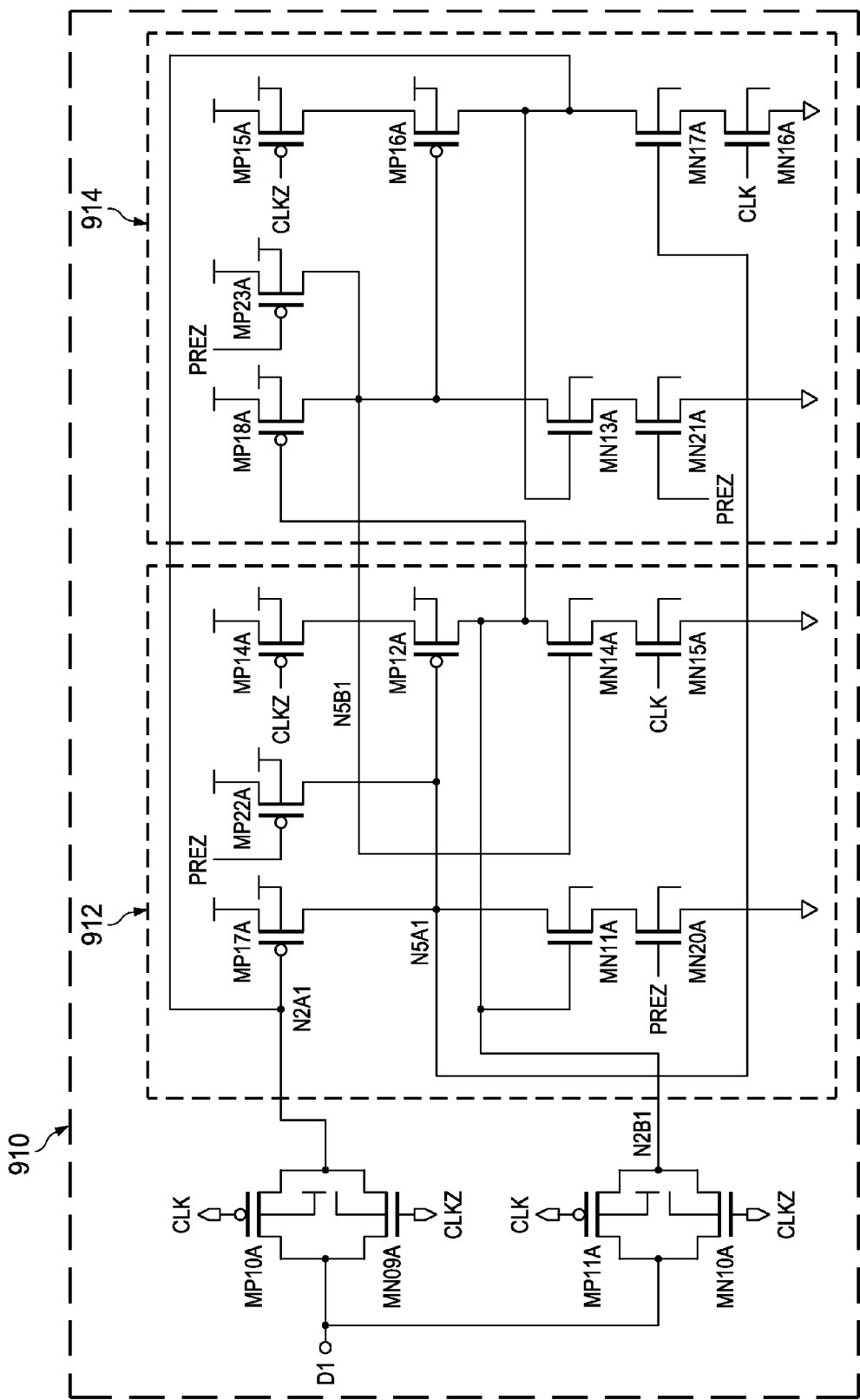
FIG. 9 is a schematic diagram illustrating a soft-error resistant latch with asynchronous preset in accordance with embodiments of the disclosure.

FIG. 9 is a schematic diagram illustrating a soft-error resistant latch with asynchronous preset in accordance with embodiments of the disclosure. Latch 910 has an asynchronous preset mechanism as well as a lower susceptibility to soft-errors (over latch 210, for example) at least because latch 910 is arranged to reduce the number of nodes at clocked transistors that are susceptible to single-event transients.

In operation, signals CLK and CLKZ are used to load signal D1 synchronously in latch 910 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 910. The latch 910 stores data using redundant inverters (such as the cross-coupled inverter of each stage 912 and 914 of latch 910). Latch 910 thus maintains a given data state at nodes N2A1 and N2B1 through active feedback.

In contrast to the latch 210 discussed above, fewer critical nodes exist, such as at the drains of transistors MP17A, MN14A, MP18A, MN17A, MN11A, MP12A, MN13A, MP16A, depending on how the transistors are biased. Thus, latch 910 has eight critical nodes that are possible (exclusive of the asynchronous preset drivers as discussed below), as compared with the 12 critical nodes that are possible with the latch 210. The reduction in critical nodes within the latch 910 decreases the possibility that the latch 910 would flip states due to a single-event transient.

In contrast to latch 310 above, latch 910 has transistors MP22A, MN20A, MP23A, and MN21A that are configured to preset latch 910 when a preset signal is asserted at node PREZ. When the preset signal is asserted, nodes N2A1 and N2B1 are forced low (through the feedback path) which disables transistors MN11A and MN13A. In this state, single-event transients that occur near transistors MP22A and MP23A do not cause soft errors because each of the PMOS transistors has a negligible well-to-drain voltage. Single-event transients that occur near transistors MN20A and MN21A do not cause soft errors because the off-state of transistors MN11A and MN13A separate the node from any control gate.

When the preset signal is inactivated, nodes N2A1 and N2B1 may be high or low. When the nodes N5A1 and N5B1 are high, transistors MP22A and MP23A are not susceptible (to a soft error resulting from single-event transient) because there is no drain-to-well voltage gradient, and transistors MN20A and MN21A are not susceptible because the drains and substrate of each transistor are low and there is no drain-to-substrate voltage gradient. When the nodes N5A1 and N5B1 are low, transistors MP22A and MP23A are susceptible to a soft error because there is a drain-to-well voltage gradient, and transistors MN20A and MN21A are not susceptible to a soft error because both the drain and substrate are low and there is no drain-to-substrate voltage gradient. Single-event transients that occur near transistors MP22A and MP23A can cause soft errors if the associated critical nodes are closely spaced when nodes N5A1 and N5B1 are low. Single-event transients that occur near transistors MN20A and MN21A do not cause soft errors because the NMOS transistors have a negligible substrate-to-drain voltage.

Clock node CLKZ is coupled to the gates of transistors MP14A and MP15A, while clock node CLK is coupled to the gates of transistors MN15A and MN16A. When CLK is high (and node CLKZ is low, latch 912 is latched, and the clocked transistors in stage 912 and stage 914 of latch 910 are ON, which drives the redundant feedback paths. In this arrangement, the conditions for establishing a critical node in a latched state are avoided because no substantial voltage gradient is established across the drain-substrate junctions of the clocked transistors when the latch 912 is in a latched state.

Figure 10:
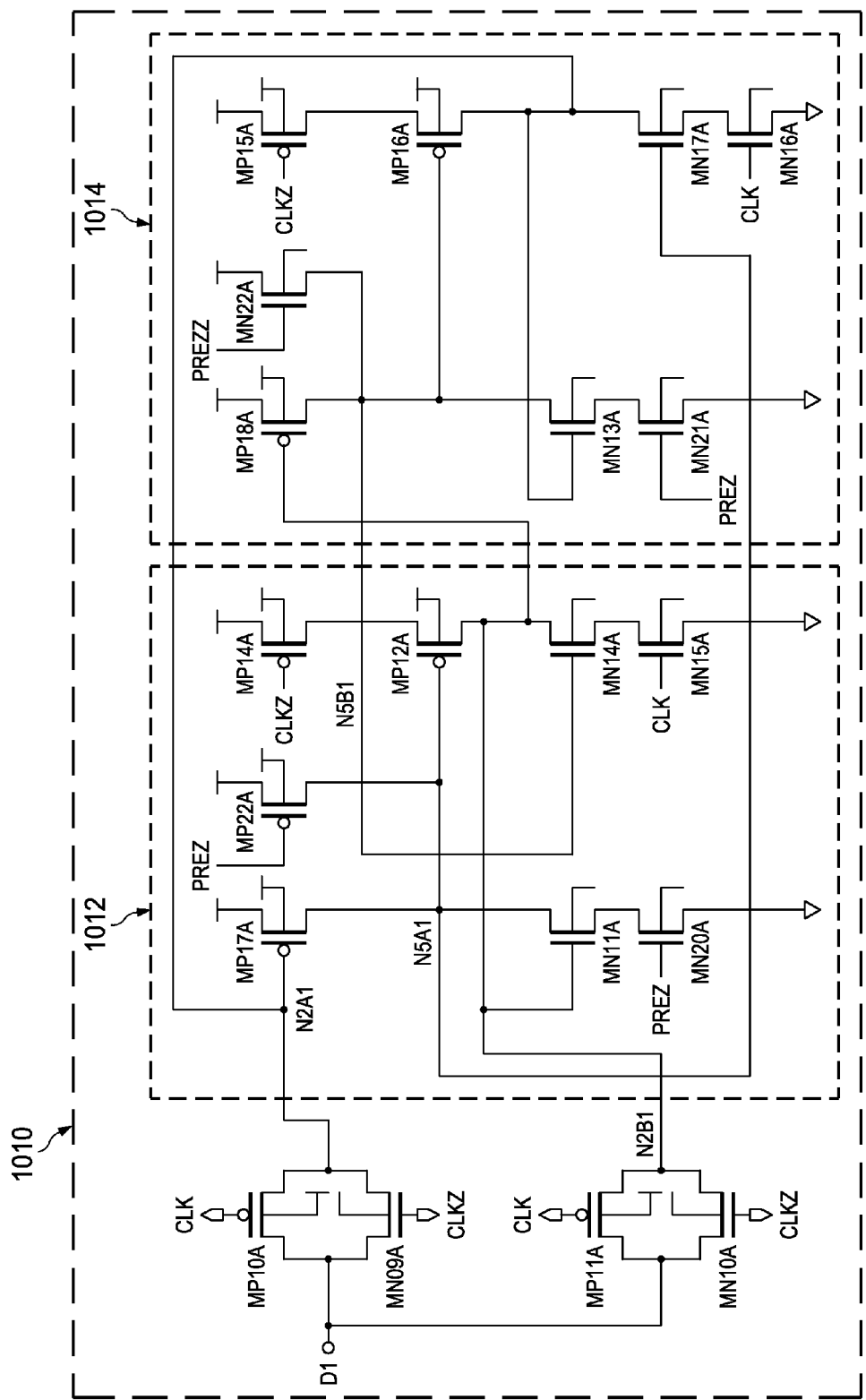
FIG. 10 is a schematic diagram illustrating a soft-error resistant latch with asynchronous preset transistors of opposite polarities in accordance with embodiments of the disclosure.

FIG. 10 is a schematic diagram illustrating a soft-error resistant latch with asynchronous preset transistors of opposite polarities in accordance with embodiments of the disclosure. Latch 1010 has an asynchronous preset mechanism as well as a lower susceptibility to soft-errors (over latch 910, for example) at least because latch 1010 is has two redundant stages 1012 and 1014, each of which is controlled by a preset signal that is applied using mutually differing polarities.

In operation, signals CLK and CLKZ are used to load signal D1 synchronously in latch 1010 (via transistors MP10A, MN09A, MP11A, and MN10A). Transistors MP10A, MN09A, MP11A, and MN10A are paired to form transfer gates that are used to drive signal D1 at nodes N2A1 and N2B1 (respectively) which sets the latch 1010 to the value of signal D1. The latch 1010 stores data using redundant inverters (such as the cross-coupled inverter of each stage 1012 and 1014 of latch 1010). Latch 1010 thus maintains a given data state at nodes N2A1 and N2B1 through active feedback.

In contrast to the latch 210 discussed above, fewer critical nodes exist, such as at the drains of transistors MP17A, MN14A, MP18A, MN17A, MN11A, MP12A, MN13A, MP16A, depending on how the transistors are biased. Thus, latch 1010 has eight critical nodes that are possible (exclusive of the asynchronous preset as discussed below), as compared with the 12 critical nodes that are possible with the latch 210. As disclosed herein, transistors MP22A and MN22A (in separate stages) are not susceptible at the same time, which enables a first stage to reset a second stage that erroneously flips states. The reduction in critical nodes within the latch 1010 decreases the possibility that the latch 1010 would flip states due to a single-event transient.

Latch 1010 has transistors MP22A, MN20A, MN22A, and MN21A that are configured to preset latch 1010 when a preset signal is asserted at nodes PREZZ and PREZ. In contrast to latch 910 described above, stage 1014 of latch 1010 has the NMOS transistor MN22A that is coupled directly to the upper supply rail (e.g., VSS) and is controlled by the signal at node PREZ. The signal at node PREZZ is the logical inversion of the signal at node PREZ and thus the nodes PREZZ and PREZ are at opposing polarities. Node PREZZ is coupled to the gate of NMOS transistor MN22A, which has a source coupled to VSS.

When the preset signal is asserted, the applied voltage to the gates of PMOS transistor MP22A and NMOS transistors MN20A and MN21A is low, while the applied voltage to the gate of NMOS transistor MN22A (coupled to VSS in stage 1014) is high. In this state, transistors MN20A and MN21A do not add to the susceptibility of the latch because transistors MN11AA and MN13A are turned off and thus do not flip any node that is coupled to a control gate. When nodes N5A1 and N5B1 are low, transistor MP22A is susceptible to a soft error (because there is a voltage gradient from drain to well), while transistor MN22A is not susceptible to a soft error when node N5B1 is low (because both the substrate and drain of transistor MN22A are low and there is no voltage gradient from drain to substrate). When nodes N5A1 and N5B1 are high, transistor MP22A is not susceptible to a soft error (because both the well and drain of transistor MP22A are high and there is no voltage gradient from drain to well), while transistor MN22A is susceptible to a soft error (because there is a voltage gradient from the drain to substrate of the transistor). A single-event transient occurring near complementary transistors MP22A and MN22A during assertion of the preset signal would not cause a change in the state of the latch because transistors MP22A and MN22A are not susceptible to single-event transients at the same time.

When the preset signal is inactivated, nodes N2A1 and N2B1 may be high or low. When the preset signal is inactivated, the nodes N5A1 and N5B1 may be high or low. When the nodes N5A1 and N5B1 are high, transistor MP22A is not susceptible (to a soft error resulting from single-event transient) because there is no drain-to-well voltage gradient, transistor MN22A is susceptible to a soft error because there is a drain-to-substrate voltage gradient, and transistors MN20A and MN21A are not susceptible because the drains and substrate of each transistor are low and there is no drain-to-substrate voltage gradient. When the nodes N5A1 and N5B1 are low, transistor MP22A is susceptible to a soft error because there is a drain-to-well voltage gradient, transistor MN22A is not susceptible to a soft error because there is no drain-to-substrate voltage gradient, and transistors MN20A and MN21A are not susceptible to a soft error because both the drain and substrate are low and there is no drain-to-substrate voltage gradient. Single-event transients that occur near transistors MP22A and MN22A do not cause soft errors because the associated critical nodes are not susceptible at the same time and do not cause the state of latch 1010 to flip (because, for example, of the redundancy provided by stages 1012 and 1014). Single-event transients that occur near transistors MN20A and MN21A do not cause soft errors because the NMOS transistors have a negligible substrate-to-drain voltage. Accordingly, the asynchronous preset drivers do not contribute to the susceptibility of latch 1010 when the preset signal is not asserted.

Clock node CLKZ is coupled to the gates of transistors MP14A and MP15A, while clock node CLK is coupled to the gates of transistors MN15A and MN16A. When CLK is high (and node CLKZ is low, latch 1012 is latched, and the clocked transistors in stage 1012 and stage 1014 of latch 1010 are on, which drives the redundant feedback paths. In this arrangement, the conditions for establishing a critical node in a latched state are avoided because no substantial voltage gradient is established across the drain-substrate junctions of the clocked transistors when the latch 1012 is in a latched state.

Figure 11:
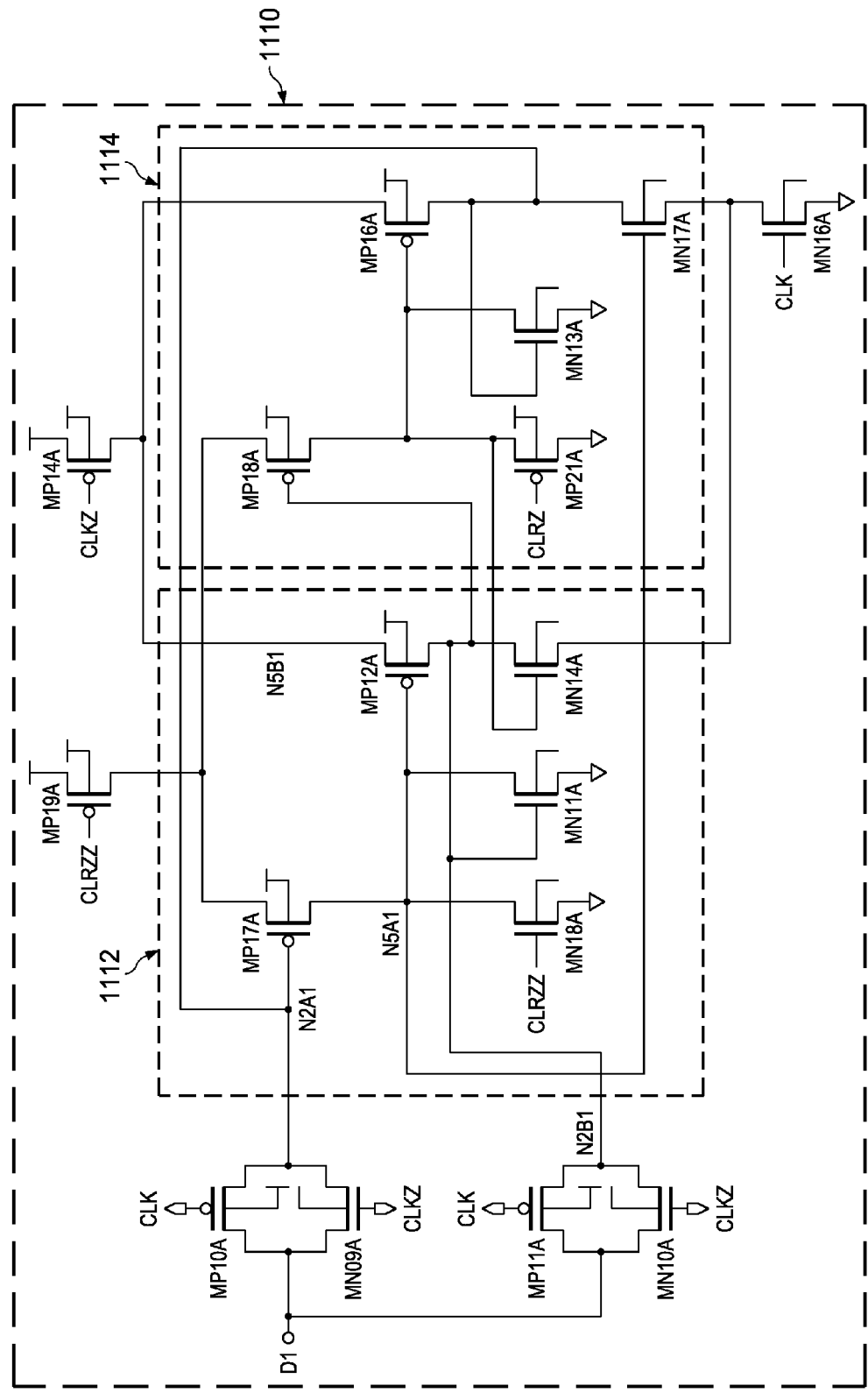
FIG. 11 is a schematic diagram illustrating a reduced-transistor soft-error resistant latch with asynchronous clear transistors of opposite polarities in accordance with embodiments of the disclosure.

FIG. 11 is a schematic diagram illustrating a reduced-transistor soft-error resistant latch with asynchronous clear transistors of opposite polarities in accordance with embodiments of the disclosure. The latch 1110 includes a single high-side transistor (e.g., MP19A) that is used to clear both stages 1112 and 1114 (e.g., by coupling the drain of a single transistor MP19A) to the sources of transistors MP17A and MP18A). The latch 1110 also includes transistors MP19A, MN18A, and MP21A that are configured to clear latch 1110 when a clear signal is asserted at node CLRZ. Transistors MN18A and MP21A are complementary (stage set) transistors, both of which are not susceptible to a simultaneous change in state of the redundant circuits in response to a single-event transient. The latch 1110 also includes a single high-side transistor (MP14A) and a single low-side transistor (MN16A) that can be used to drive the second inverter in both stages 1112 and 1114 (as similarly shown in FIG. 4)

Figure 12:
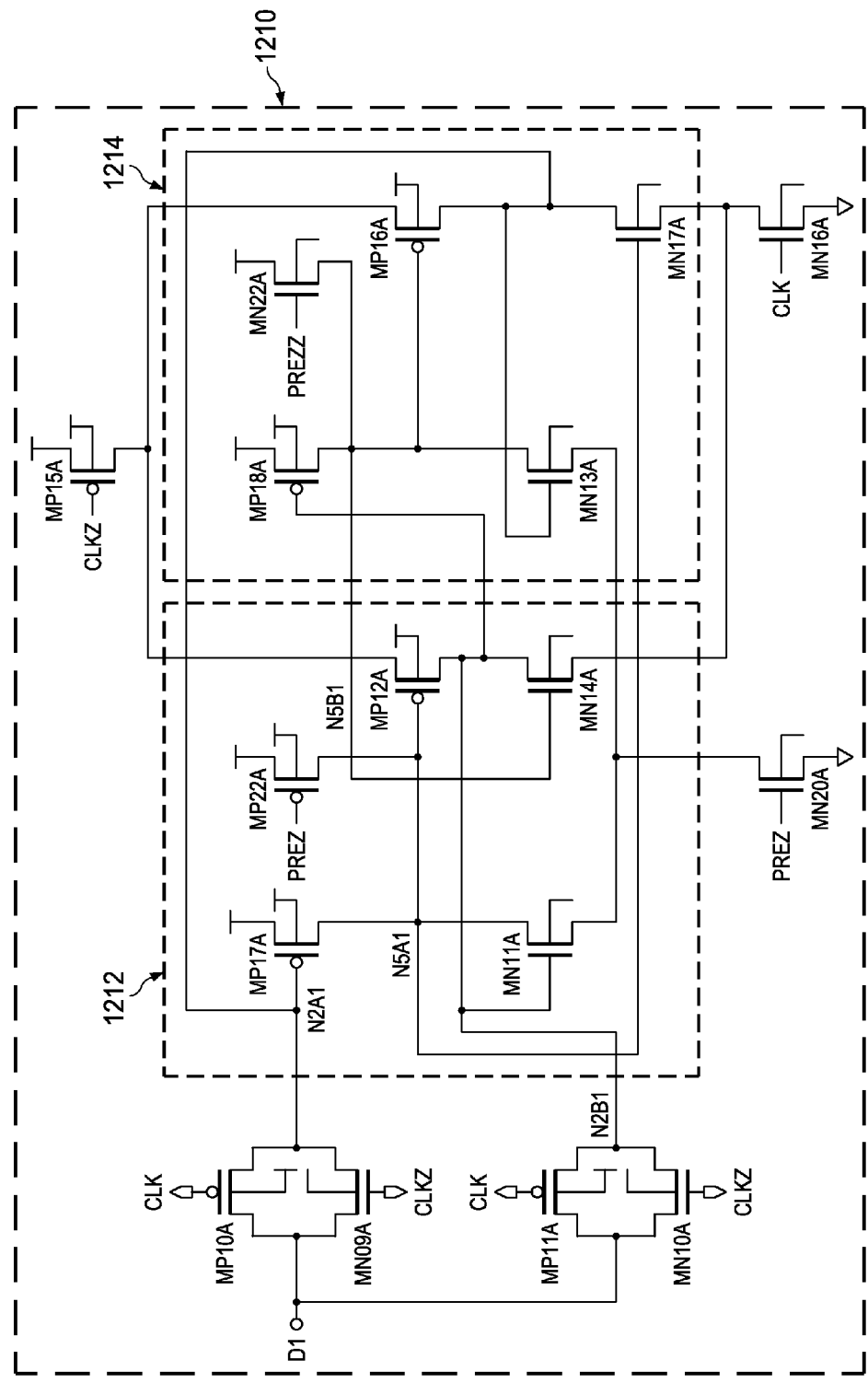
FIG. 12 is a schematic diagram illustrating a reduced-transistor soft-error resistant latch with asynchronous preset transistors of opposite polarities in accordance with embodiments of the disclosure.

FIG. 12 is a schematic diagram illustrating a reduced-transistor soft-error resistant latch with asynchronous preset transistors of opposite polarities in accordance with embodiments of the disclosure. The latch 1210 includes a single high-side transistor (MP15A) and a single low-side transistor (MN16A) can be used to drive the second inverter in both stages 1212 and 1214 (as similarly shown in FIG. 4). The latch 1210 also includes transistors MP22A, MN22A, and MN20A that are configured to preset latch 1210 when a preset signal is asserted at node PREZ. Transistors MP22A and MN22A are complementary (stage set) transistors, both of which are not susceptible to a simultaneous change in state of the redundant circuits in response to a single-event transient. A single low-side transistor (e.g., MN20A) can be used to preset both stages 1212 and 1214 (e.g., by coupling the drain of a single transistor MN20A to the sources of transistors MN11A and MN13A).

In an alternative embodiment, the soft-error resistant latch can be both asynchronously set to either of two states in response to preset and clear signals. The soft-error resistant latch includes a first asynchronous clear transistor of a first polarity (such as PMOS) coupled between a first power rail and an intermediary node in a first latch stage, a second asynchronous clear transistor of a polarity opposite (such as NMOS) the first polarity coupled between a first power rail and an intermediary node in a second latch stage, a first asynchronous preset transistor of a second polarity coupled between a second power rail and the intermediary node in the first latch stage, and a second asynchronous clear transistor of a polarity opposite the second polarity coupled between the second power rail and the intermediary node in the second latch stage.

For example, the transistors used to asynchronously clear latch 810 (PMOS transistors MP19A, MP20A, MP21A and NMOS transistor MN18A can also be similarly included in latch 1210. PMOS transistor MP19A can be coupled between VSS and an intermediary node (N5A1) of stage 1212, PMOS transistor MP20A can be coupled between VSS and an intermediary node (N5B1) of stage 1214, NMOS transistor MN18A can be coupled between an intermediary node (N5A1) of stage 1212 and VDD, and PMOS transistor MP21A can be coupled between an intermediary node (N5B1) of stage 1214 and VDD.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:
1. A soft error resistant latch circuit comprising:
A. a data input lead;
B. a clock input lead;
C. an inverted clock input lead;
D. a VSS power rail;
E. a VDD power rail;
F. two sets of transfer gates, each set of transfer gates having an input connected to the data input lead, an input connected to the clock input lead, an input connected to the inverted clock input lead, and an output; and

G. inverter circuitry having:
   i. first and second transistors connected between the VSS and VDD power rails with a first node between the first and second transistors, the first transistor having a control lead connected to the output of one set of transfer gates, and the second transistor having a control lead connected to the other set of transfer gates;
   ii. third, fourth, fifth, and sixth transistors connected between the VSS and VDD power rails with a second node between the fourth and fifth transistors, the fourth transistor having a control lead connected to the inverted clock input lead, the fourth transistor having a control lead connected to the first node, the fifth transistor having a control lead, and the sixth transistor having a control lead connected to the clock input lead;
   iii. seventh and eighth transistors connected between the VSS and VDD rails with a third node between the seventh and eighth transistors, the seventh transistor having a control lead connected to the second node, the third node being connected to the control lead of the fifth transistor, and the eighth transistor having a control lead;
   iv ninth, tenth, eleventh, and twelfth transistors connected between the VSS and VDD rails with a fourth node between the tenth and eleventh transistors, the tenth transistor having a control lead connected to the inverted clock input lead, the tenth transistor having a control lead connected to the third node, the fourth node being connected to the control lead of the eighth transistor and to the control lead of the first transistor, the eleventh transistor having a control lead connected to the first node, and the twelfth transistor having a control lead connected to the clock input lead; and
   v. the first, third, fourth, seventh, ninth, and tenth transistors are PMOS transistors, and the second, fifth, sixth, eighth, eleventh, and twelfth transistors are NMOS transistors.

* * * * *

UNITED STATES PATENT AND TRADEMARK OFFICE
CERTIFICATE OF CORRECTION

PATENT NO.        : 8,384,419 B2
APPLICATION NO.   : 12/960548
DATED             : February 26, 2013
INVENTOR(S)       : Lavery et al.

It is certified that error appears in the above-identified patent and that said Letters Patent is hereby corrected as shown below:

In the Claims:

Column 14, Line 57 - Column 16, Line 18 should read

Claim 1. A soft error resistant latch circuit comprising:
A. a data input lead;
B. a clock input lead;
C. an inverted clock input lead;
D. a VSS power rail;
E. a VDD power rail;
F. two sets of transfer gates, each set of transfer gates having an input connected to the data input lead, an input connected to the clock input lead, an input connected to the inverted clock input lead, and an output; and
G. inverter circuitry having:
i. first and second transistors connected between the VSS and VDD power rails with a first node between the first and second transistors, the first transistor having a control lead connected to the output of one set of transfer gates, and the second transistor having a control lead connected to the other set of transfer gates;
ii. third, fourth, fifth, and sixth transistors connected between the VSS and VDD power rails with a second node between the fourth and fifth transistors, the ~~fourth~~ <u>third</u> transistor having a control lead connected to the inverted clock input lead, the fourth transistor having a control lead connected to the first node, the fifth transistor having a control lead, and the sixth transistor having a control lead connected to the clock input lead;
iii. seventh and eighth transistors connected between the VSS and VDD rails with a third node between the seventh and eighth transistors, the seventh transistor having a control lead connected to the second node, the third node being connected to the control lead of the fifth transistor, and the eighth transistor having a control lead;
iv. ninth, tenth, eleventh, and twelfth transistors connected between the VSS and VDD rails with a fourth node between the tenth and eleventh transistors, the ~~tenth~~ <u>ninth</u> transistor having a control lead Signed and Sealed this
Fourteenth Day of May, 2013

Teresa Stanek Rea
*Acting Director of the United States Patent and Trademark Office* connected to the inverted clock input lead, the tenth transistor having a control lead connected to the third node, the fourth node being connected to the control lead of the eighth transistor and to the control lead of the first transistor, the eleventh transistor having a control lead connected to the first node, and the twelfth transistor having a control lead connected to the clock input lead; and v. the first, third, fourth, seventh, ninth, and tenth transistors are PMOS transistors, and the second, fifth, sixth, eighth, eleventh, and twelfth transistors are NMOS transistors.